United States Patent
Khalili et al.

(10) Patent No.: US 9,698,727 B1
(45) Date of Patent: Jul. 4, 2017

(54) COUPLED INDUCTOR-BASED RESONATOR

(71) Applicant: QUALCOMM Incorporated, San Diego, CA (US)

(72) Inventors: Alireza Khalili, Sunnyvale, CA (US); Mazhareddin Taghivand, Campbell, CA (US); Amirpouya Kavousian, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/965,760

(22) Filed: Dec. 10, 2015

(51) Int. Cl.
*H03B 5/08* (2006.01)
*H03B 1/04* (2006.01)
*H03B 5/12* (2006.01)
*H01F 27/28* (2006.01)

(52) U.S. Cl.
CPC ............ *H03B 1/04* (2013.01); *H01F 27/2804* (2013.01); *H03B 5/1209* (2013.01); *H03B 5/1212* (2013.01); *H03B 2200/004* (2013.01); *H03B 2200/009* (2013.01)

(58) Field of Classification Search
CPC ...... H03B 5/12; H03B 5/1212; H03B 5/1209; H03B 1/04; H03B 2200/004; H03B 2200/009; H01F 27/2804
USPC ................. 331/167, 117 R, 117 FE; 336/200
See application file for complete search history.

(56) References Cited

U.S. PATENT DOCUMENTS

| | | | |
|---|---|---|---|
| 6,879,234 B2 | 4/2005 | Furumiya et al. | |
| 7,154,349 B2 | 12/2006 | Cabanillas | |
| 7,633,352 B2 | 12/2009 | El Rai | |
| 7,764,127 B2 | 7/2010 | Sun et al. | |
| 8,102,216 B1 | 1/2012 | Kaczynski | |
| 8,351,867 B2* | 1/2013 | Wachi | H03L 7/099 331/109 |
| 2007/0018767 A1 | 1/2007 | Gabara et al. | |
| 2010/0295625 A1 | 11/2010 | Tanabe | |
| 2011/0051308 A1 | 3/2011 | Chan | |
| 2015/0130545 A1 | 5/2015 | Chen et al. | |

OTHER PUBLICATIONS

Hooman Darabi, "Radio Frequency Integrated Circuits and Systems",Cambridge Univ. Press, May 2015, pp. 344-348.*

(Continued)

*Primary Examiner* — Arnold Kinkead
(74) *Attorney, Agent, or Firm* — Procopio, Cory, Hargreaves & Savitch LLP

(57) ABSTRACT

A two-walled coupled inductor includes an outer wall and an inner wall separated by a slit. The outer wall has a first width and the inner wall has a second width. The inner wall and the outer wall may be configured to be coupled to oscillator circuitry. The two-walled coupled inductor may include an electrically conductive stub coupled to the outer wall to be coupled to a power supply. A common mode current flows through the outer wall, and the stub if one is present, and a differential mode current flows through both the outer wall and the inner wall, but not the stub. The first and second widths, and dimensions of the stub, may be sized to increase an inductance of the common mode compared to an inductance of the differential mode, thereby reducing phase noise of the inductor-based resonator.

24 Claims, 7 Drawing Sheets

(56) References Cited

OTHER PUBLICATIONS

Mellouli D., et al., "Design and Implementation of a 6-GHz Array of Four Differential VCOs Coupled Through a Resistive Network," Analog Integrated Circuits and Signal Processing, Springer Verlag (Germany), 2013, vol. 76 (2), pp.179-193.
Hegazi E., et al., "A Filtering Technique to Lower LC Oscillator Phase Noise", IEEE Journal of Solid-State Circuits, vol. 36, No. 12, Dec. 2001, pp. 1921-1930.
International Search Report and Written Opinion—PCT/US2016/060980—ISA/EPO—Mar. 10, 2017.
Murphy D., et al., "25.3 A VCO with Implicit Common-Mode Resonance", Solid-State Circuits Conference—(ISSCC), 2015 IEEE International. IEEE, 2015, 3 Pages.
Shahmohammadi M., et al., "25.4 A 1/f Noise Upconversion Reduction Technique Applied to Class-D and Class-F Oscillators", Solid-State Circuits Conference—(ISSCC), 2015 IEEE International. IEEE, 2015, 3 Pages.

* cited by examiner (VCO circuitry 115 with two-walled coupled inductor 102)

COUPLED INDUCTOR-BASED RESONATOR

BACKGROUND

Field

The present disclosure relates to electronic circuits and, more particularly, to inductor-based resonators for voltage controlled oscillators.

Background

Voltage controlled oscillator (VCO) phase noise is often a major contributor to the overall phase noise in circuits utilizing an electronic oscillator such as phase locked loop (PLL) circuit. Conventional VCO designs may require significant power and area to meet typical specifications of wireless communication systems. The presence of higher harmonic components in an active transconductance (gm) device can cause a frequency drift of an inductor-capacitor (LC) tank resonance if the LC tank impedance at the higher harmonics is not high. This phenomenon, named the Groszkowski effect, is a contributor to noise in LC VCOs. Any technique that improves phase noise, while at the same time does not consume large area and power, is desirable.

SUMMARY

In one aspect, a two-walled coupled inductor is provided. The two-walled coupled inductor includes: a first electrically conductive wall having a first end, a second end and a first width and a second electrically conductive wall separated from the first wall by a slit, the second wall having a first end, a second end and a second width, where the second width is different from the first width. The two-walled coupled inductor further includes a first node where the first ends of the first and second electrically conductive walls are coupled; and a second node where the second ends of the first and second electrically conductive walls are coupled. One of the first and second walls is configured to be coupled to a power supply and the first and second nodes are configured to be coupled to voltage controlled oscillator (VCO) circuitry such that a common mode current flows through the one of the first and second walls coupled to the power supply and a differential mode current flows through both the first wall and the second wall.

In one aspect, a method of designing a two-walled coupled inductor is provided. The method includes: simulating electromagnetic coupling of at least a differential mode and a common mode in the two-walled coupled inductor, the two-walled coupled inductor comprising: a first electrically conductive wall having a first end, a second end and a first width, a second electrically conductive wall separated from the first wall by a slit, the second wall having a first end, a second end and a second width, a first node where the first ends of the first and second electrically conductive walls are coupled, and a second node where the second ends of the first and second electrically conductive walls are coupled. One of the first and second walls is coupled to a power supply and the first and second nodes are coupled to voltage controlled oscillator (VCO) circuitry such that a common mode current flows through the one of the first and second walls coupled to the power supply and a differential mode current flows through both the first wall and the second wall. The method further includes: estimating, based on the simulated electromagnetic coupling, phase noises of the two-walled coupled inductor for a plurality of combinations of the first width and the second width; and sizing the first width and the second width based on the estimated phase noises to reduce the phase noise of the two-walled coupled inductor.

In one aspect, a method of reducing phase noise in a voltage controlled oscillator is provided. The method includes: flowing common mode current through a first wall of a two-walled coupled inductor, and flowing differential mode current through the first wall and a second wall of the two-walled inductor, the first and second wall being separated at least partially by a slit.

In one aspect, an apparatus is provided. The apparatus includes: a first means for conducting electrical current comprising a first end, a second end and a first width; a second means for conducting electrical current comprising a first end, a second end and a second width, where the first width is different from the second width, the second means for conducting electrical current and first means for conducting electrical current separated by a slit. The apparatus further includes first means for coupling the first ends of the first and second means for conducting electrical current; and second means for coupling the second ends of the first and second means for conducting electrical current. The apparatus further includes means for supplying electrical current coupled to one of the first and second means for conducting electrical current such that a common mode current flows through the one of the first and second means for conducting electrical current and a differential mode current flows through both the first and second means for conducting electrical current.

In one aspect, a voltage controlled oscillator (VCO) is provided. The VCO includes: a two-walled coupled inductor that includes: a first electrically conductive wall having a first end, a second end and a first width, a second electrically conductive wall separated from the first wall by a slit, the second wall having a first end, a second end and a second width, wherein the second width is different from the first width. The two-walled coupled inductor further includes: a first node where the first ends of the first and second electrically conductive walls are coupled, and a second node where the second ends of the first and second electrically conductive walls are coupled. The VCO further includes VCO circuitry coupled to the first node and the second node. One of the first and second walls is configured to be coupled to a power supply such that a common mode current flows through the one of the first and second walls coupled to the power supply and a differential mode current flows through both the first wall and the second wall.

Other features and advantages of the present disclosure should be apparent from the following description which illustrates, by way of example, aspects of the disclosure.

BRIEF DESCRIPTION OF THE DRAWINGS

The details of the present disclosure, both as to its structure and operation, may be gleaned in part by study of the accompanying drawings, in which like reference numerals refer to like parts, and in which.

DETAILED DESCRIPTION

Figure 1:
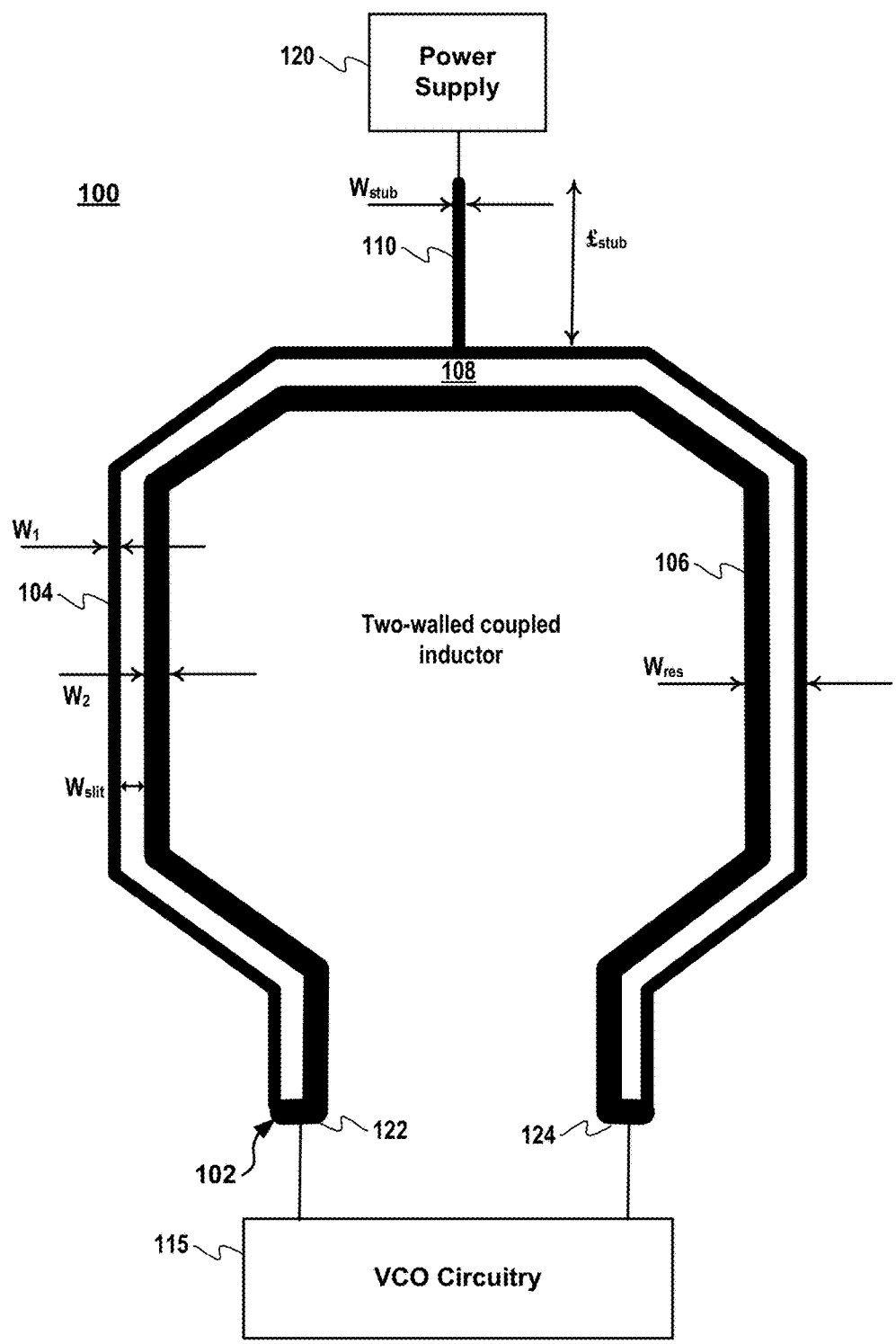
FIG. 1 is block diagram of a voltage controlled oscillator (VCO) that utilizes a two-walled coupled inductor.

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

An inductor-based resonator that provides for increased tank impedance at the second harmonic (common mode) is described. The inductor-based resonator has a configuration that allows this increase of impedance at the common mode frequency without requiring increased resonator area. The inductor-based resonator takes advantage of being able to fine tune inductances of both the common mode and a differential mode (first harmonic at the desired VCO frequency) independently.

In an exemplary LC VCO, the ratio of the common mode inductance and the differential mode inductance, $L_{CM}/L_{diff}$, is ~¼. Since the common mode resonance frequency is twice the differential mode frequency, the ratio of VCO circuit capacitances at the common mode and the differential mode, $C_{CM}/C_{diff}$, needs to be ~1. Since capacitance distribution is a function of VCO circuit parasitics and may be hard to control, a resonator configuration that enables a way to increase the $L_{CM}/L_{diff}$ ratio above ¼ is desired.

In various examples, the main harmonic to be suppressed is the second harmonic of the common mode current. The desired harmonic is the first harmonic of the differential mode current. In various examples, a two-walled coupled inductor that includes an outer wall and an inner wall separated by a slit is provided. The two-walled coupled inductor is configured such that the common mode current flows through the outer wall and the differential mode current flows through both the outer wall and the inner wall. In various examples, a stub is connected to the outer wall such that the common mode current also flows through the stub, but the differential mode does not. The dimensions of the stub and the outer wall determine the inductance of the common mode while the combined widths of the outer and inner walls determine the inductance of the differential mode. As long as the combined width of the outer and inner walls is the same, the inductance of the differential mode stays essentially the same.

Table 1 shows the effect on inductance of the differential and common modes by adding the slit to separate the outer and inner walls.

TABLE 1

| Configuration | Diff. Mode Induct. picohenries (pH) | Common Mode Induct. (pH) |
| --- | --- | --- |
| No Slit | 251.8 | 65.3 |
| With Slit | 255.1 | 80.5 |

As can be seen, the addition of the slit to form inner an outer walls increases the inductance of the common mode by about 23% while the inductance of the differential mode is only changed by about 1.3%. Thus, by positioning the slit to change the thicknesses of the outer and inner walls, while keeping the combined thickness of the inner and outer walls the same, the second harmonic of the common mode can be suppressed without, at least substantially, affecting the differential mode inductance and without increasing the power and area requirements.

FIG. 1 is a block diagram of a VCO 100 with a two-walled coupled inductor 102 having an electrically conductive outer wall 104 (referred to from hereon as the outer wall 104) and an electrically conductive inner wall 106 (referred to from hereon as the inner wall 106). The configuration of the outer wall 104 and the inner wall 106 define a slit 108 such that the inner wall 106 is separated from the outer wall 104 by the slit 108, and an electrically conductive stub 110 (referred to from hereon as the stub 110) extending from the outer wall 104. The outer wall 104 and the inner wall 106, in this example, are formed as two concentric rings or loops that each comprise respective first and second ends coupled at first and second nodes 122 and 124 respectively. The outer wall 104 and the inner wall 106 are electrically connected to VCO circuitry 115 via the first and second nodes 122 and 124. The outer wall 104, in this example, is coupled to a power supply 120.

Other configurations of the outer wall 104 and the inner wall 106 may also be used. For example, the stub 110 and the power supply 120 may be coupled to the inner wall 106. The VCO circuitry 115 may include all of the circuitry needed for controlling an oscillating electrical waveform produced by the two-walled coupled inductor 102. For example, the VCO circuitry 115 may include PMOS and NMOS transistors, an amplifier, capacitors (variable and/or fixed), a delay circuit, a buffer, a divider circuit, etc.

The stub 110 is electrically connected to the power supply 120 (e.g., a voltage source, a current source, etc.) that provides power to the components of the VCO 100. The outer wall 104, the inner wall 106 and the stub 110 may all be formed of a low-loss metal, a more lossy metal or some other conductive material. A width $W_1$ of the outer wall 104, a width $W_2$ of the inner wall 106, a width $W_{slit}$ of the slit 108, a width $W_{stub}$ of the stub 110 and a length $\ell_{stub}$ of the stub 110 are sized to provide proper inductances for the common mode and the differential mode of the VCO 100. In various embodiments, the inductances are chosen to tune desired resonant frequencies of the differential mode and the common mode, and to increase an inductance of the common mode compared to an inductance of the differential mode. The combined width of the two-walled coupled inductor 102, $W_{res}$, is the sum of the widths $W_1$, $W_2$ and $W_{slit}$ as shown in the following formula:

$$W_{res} = W_1 + W_2 + W_{slit} \qquad (1)$$

Figure 2:
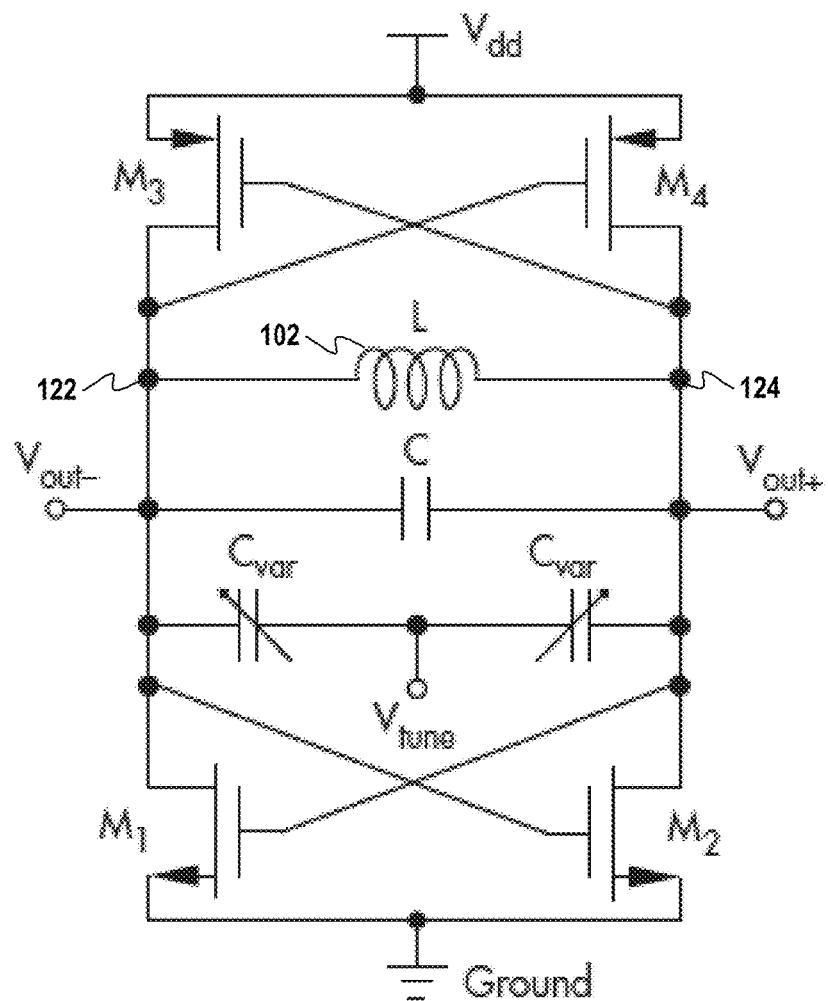
FIG. 2 is a schematic diagram of an example of voltage controlled oscillator circuitry including the two-walled coupled inductor that can be used in the VCO of FIG. 1.

FIG. 2 is a schematic diagram of an example of the VCO circuitry 115 and the two-walled coupled inductor 102 that can be used in the VCO 100 of FIG. 1. The two-walled coupled inductor 102 of FIG. 1 is represented in FIG. 2 by an inductor labeled L that is coupled to the VCO circuitry 115 at the nodes 122 and 124. The VCO circuitry 115, in this example, includes a pair of cross coupled NMOS transistors labeled M1 and M2 and a pair of cross coupled PMOS transistors labeled M3 and M4, and a varactor diode or A-MOS variable capacitance comprising two variable capacitors, labeled $C_{var}$, controlled by a control or tuning voltage $V_{tune}$. The VCO circuitry 115 also includes a fixed capacitor labeled C. The VCO circuitry 115 of FIG. 2 is exemplary and other VCO circuitry may be used. For example, a switched capacitor bank may be coupled to the VCO circuitry 115.

Figure 3:
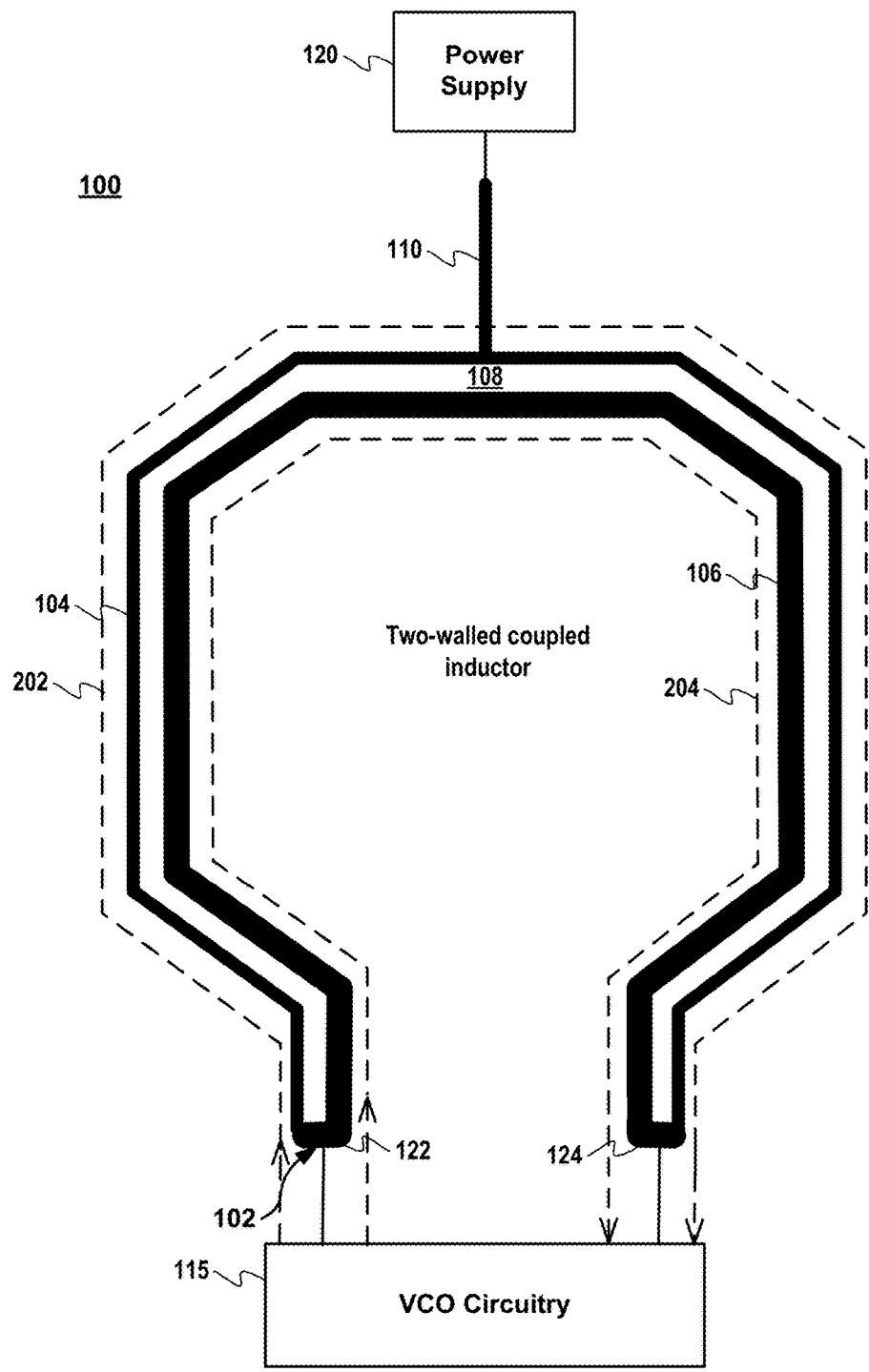
FIG. 3 is a block diagram of the VCO of FIG. 1 showing flow paths of a differential mode current through the two-walled coupled inductor in the VCO of FIG. 1.

FIG. 3 is a block diagram of the VCO 100 showing a path that a differential mode current (the first harmonic of the two-walled coupled inductor 102) follows through the two-walled coupled inductor 102. The differential mode current flows along a first differential mode path 202 from the VCO circuitry 115, up a first side of the outer wall 104, around the entire outer wall 104 and down a second side of the outer wall 104 back to the VCO circuitry 115. A second differential mode current flows through the inner wall 106 along a second differential mode path 204 flowing from the VCO circuitry 115, up a first side of the inner wall 106, around the entire inner wall 106 and down a second side of the inner wall 106 back to the VCO circuitry 115.

As illustrated in FIG. 3 the first and second paths 202 and 204 that flow though the outer wall 104 and the inner wall 106, respectively, are parallel and therefore provide two parallel inductors. A parameter a is used to vary the combined inductance of the two parallel inductors of the outer and inner walls 104 and 106, where a is defined as follows:

$$\alpha = W_2/W_1 \qquad (2)$$

where $W_2$ is the width of the inner wall 106 and $W_1$ is the width of the outer wall 104. For a fixed combined wall width $W_{res}$, when α is small, the inductance of the inner wall 106 is greater than the inductance of the outer wall 104, and when α is large, the inductance of the inner wall 106 is less than the inductance of the outer wall 104. The total combined inductance of the differential mode flowing through the outer and inner walls 104 and 106, respectively, can be minimized when α is very small or very large. The combined inductance of the differential mode is at a maximum when $W_1$ and $W_2$ are equal and α=1.0. However, the variation of differential mode inductance from minimum to maximum is small (see, for example, Table 1 above). Due to this property, the inductance of the common mode can be increased by changing the a ratio without substantially affecting the differential mode inductance.

Figure 4:
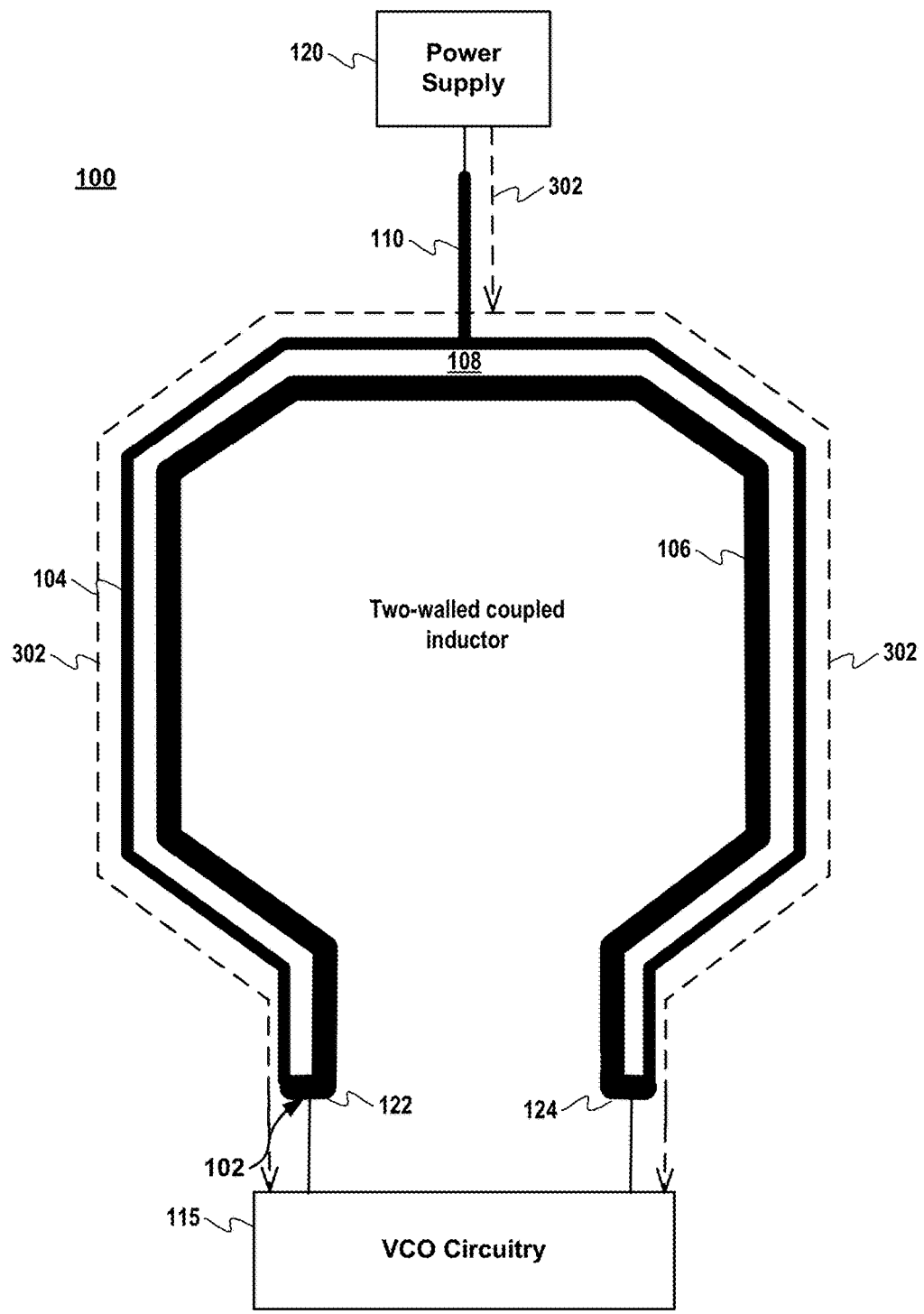
FIG. 4 is a block diagram of the VCO of FIG. 1 showing flow paths of a common mode current through the two-walled coupled inductor in the VCO of FIG. 1.

FIG. 4 is a block diagram of the VCO 100 showing a path that a common mode current (the second harmonic of the two-walled coupled inductor 102) follows through the two-walled coupled inductor 102. The common mode current flows through the outer wall along a common mode path 302 flowing from the power supply 120 down the electrically conductive stub 110 and down first and second sides of the outer wall 104 to the VCO circuitry 115. The electrically conductive stub 110 is coupled to the outer wall 104 such that the common mode current flows through the stub 110 and the outer wall 104 but the differential mode current does not flow through the stub 110 and the inductance of the common mode may be increased or decreased without changing the inductance of the differential mode significantly.

The inductance $L_{CM}$ of the common mode may be selectively increased as the length $\ell_{stub}$ of the stub 110 is increased, and/or as the width $W_{stub}$ of the stub 110 is decreased, and vice-versa. The width $W_{stub}$ and the length $\ell_{stub}$ of the stub 110 can be changed without significantly affecting the inductance of the differential mode. In addition, the width $W_1$ of the outer wall 104 can be increased to decrease the inductance of the common mode and decreased to increase the inductance of the common mode.

The dimensions of the outer wall 104, the inner wall 106 and the stub 110 can be chosen to provide inductances of the common mode and the differential mode, $L_{CM}$ and $L_{diff}$, respectively, and these dimensions can be fine-tuned in order to minimize phase noise, e.g., of a phase locked loop system that employs the VCO 100. The electromagnetic coupling of the differential mode and the common mode can thus be fine-tuned by varying the values of the outer and inner wall widths $W_1$ and $W_2$ and by varying the inductance $L_{stub}$ of the stub 110. The ratio of common mode inductance $L_{CM}$ and the differential mode inductance $L_{diff}$ can be approximated by the following equation:

$$\frac{L_{CM}}{L_{diff}} = \frac{(L_{stub} + \alpha * L_{diff})}{L_{diff}} = \frac{L_{stub}}{L_{diff}} + \alpha \qquad (3)$$

As described above, in order to minimize phase noise of oscillator circuitry (e.g., the VCO circuitry 115) coupled to the two-walled coupled inductor 102, the ratio of $L_{CM}/L_{diff\_s}$ can be increased. The dimensions of the outer wall 104, the inner wall 106 and the stub 110 can be chosen to provide inductances of the common mode and the differential mode, $L_{CM}$ and $L_{diff}$, respectively, which can minimize phase noise of the oscillator circuitry (e.g., the VCO circuitry 115). Methods of estimating phase noise known to those skilled in the art can be employed to arrive at the proper ratio of $L_{CM}/L_{diff}$ that minimizes the phase noise.

As described below, methods can be employed to identify the stub inductance $L_{stub}$ and the wall width ratio α that can minimize the phase noise in an oscillator circuit such as the VCO circuitry 115 of the VCO 100.

Figure 5:
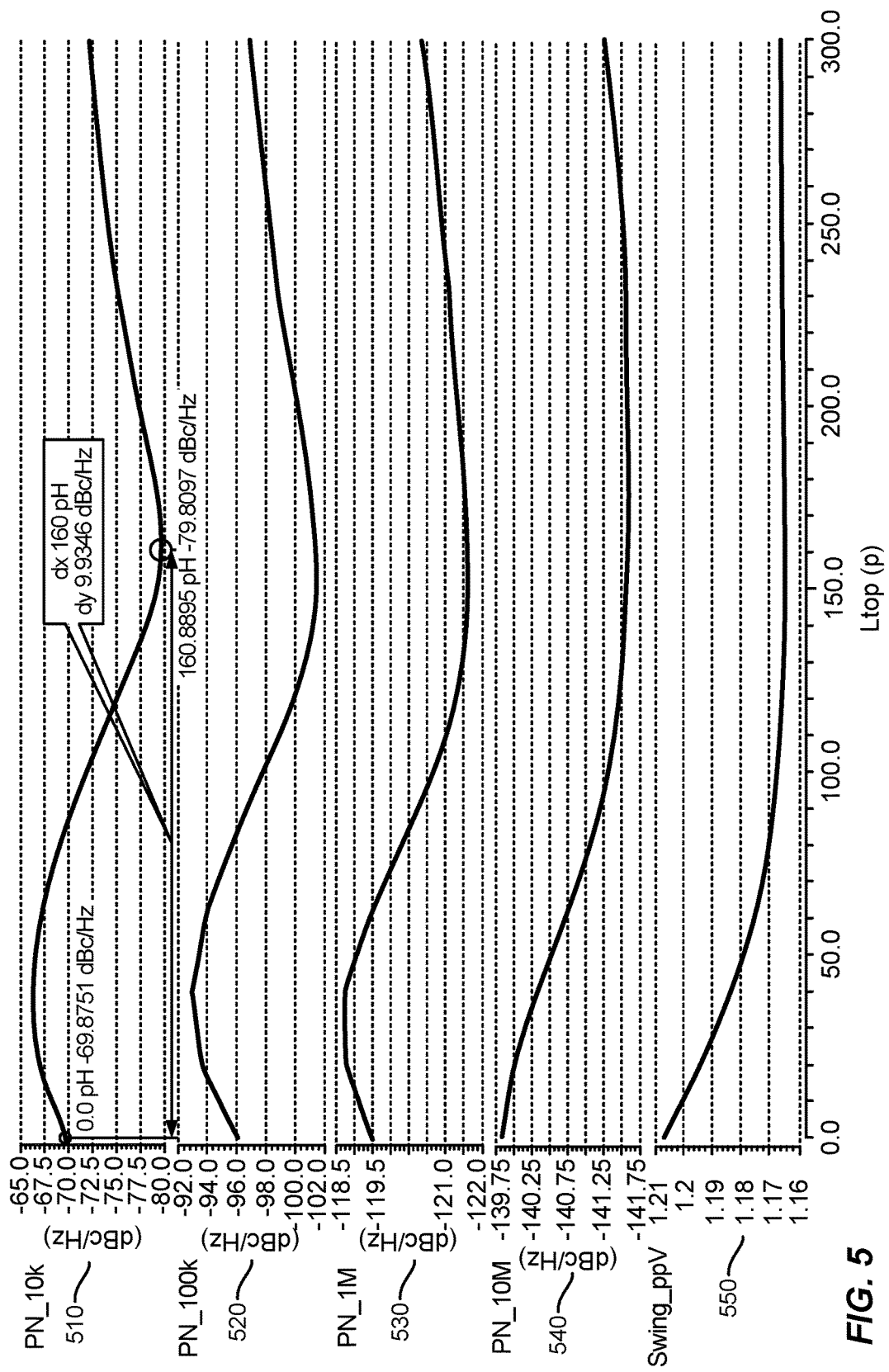
FIG. 5 is a set of graphs showing phase noise estimates versus stub inductance determined in a process for designing the two-walled coupled inductor in the VCO of FIG. 1.

FIG. 5 is a set of graphs showing phase noise estimates determined in a process described below for designing the two-walled coupled inductor 102. The phase noise estimates illustrated in FIG. 5 are determined at various frequency offsets from a center VCO frequency for a typical 12 GHz VCO circuit for various values of stub inductance $L_{stub}$. A first graph 510 shows phase noise estimates at a 10 kHz offset, a second graph 520 shows phase noise estimates at a 100 kHz offset, a third graph 530 shows phase noise estimates at a 1 MHz offset, a fourth graph 540 shows phase noise estimates at a 100 MHz offset and a fifth graph 550 shows estimates of swing of a perturbation projection vector (PPV). PPV is an established technique for oscillator phase noise analysis. As can be seen from the first graph 510, the phase noise at a 10 kHz offset from the center frequency of the VCO can be minimized at a stub inductance $L_{stub}$ of ~161 pH. This phase noise is about 10 dB lower than the phase noise would be without the stub 110 (see the phase noise at $L_{stub}=0$).

Figure 6:
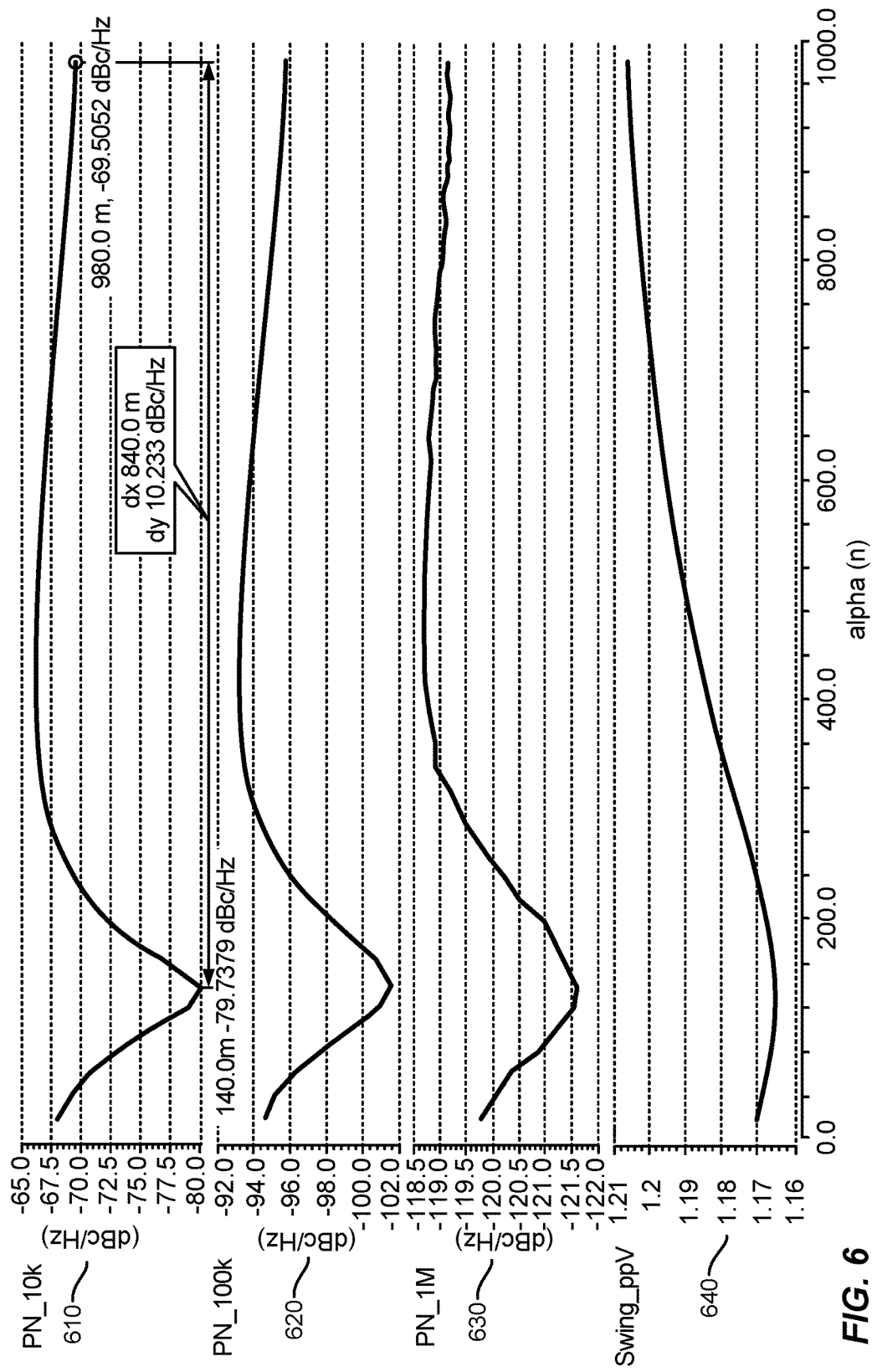
FIG. 6 is a set of graphs showing phase noise estimates versus a ratio of inner wall width to outer wall width determined in the process for designing the two-walled coupled inductor used in the VCO of FIG. 1.

FIG. 6 is a set of graphs showing phase noise estimates versus the ratio α determined in the process for designing the two-walled coupled inductor 102. The phase noise estimates are determined at various frequency offsets from the center VCO frequency for the 12 GHz VCO circuit for various inner and outer wall widths of the resonator circuit. FIG. 6 shows estimated phase noise at various frequency offsets from the center VCO frequency for the 12 GHz VCO circuit for various values of α given by equation (2) above where a determines the position of the slit 108 between between the outer wall 104 of width $W_1$ and the inner wall 106 of width $W_2$. A first graph 610 shows phase noise estimates at a 10 kHz offset, a second graph 620 shows phase noise estimates at a 100 kHz offset, a third graph 630 shows phase noise estimates at a 1 MHz offset and a fourth graph 640 shows estimates of swing of a PPV. As can be seen, the phase noise at 10 kHz offset from the center frequency of the VCO can be minimized at an α=~0.14. This phase noise is about 10 dB lower than the phase noise would be without the slit 108 (see the phase noise at α=~1000).

In the analyses for which phase noise estimates are presented in FIGS. 5 and 6, the width of the slit was not considered. The slit width $W_{slit}$ was kept constant in the analyses. In various examples of the two-walled coupled inductor 102, the slit width may be about one-half to about one-third of the combined widths of the inner and outer walls. However, slit width $W_{slit}$ may be added as a variable for further fine tuning the electromagnetic coupling of the inner and outer walls.

Figure 7:
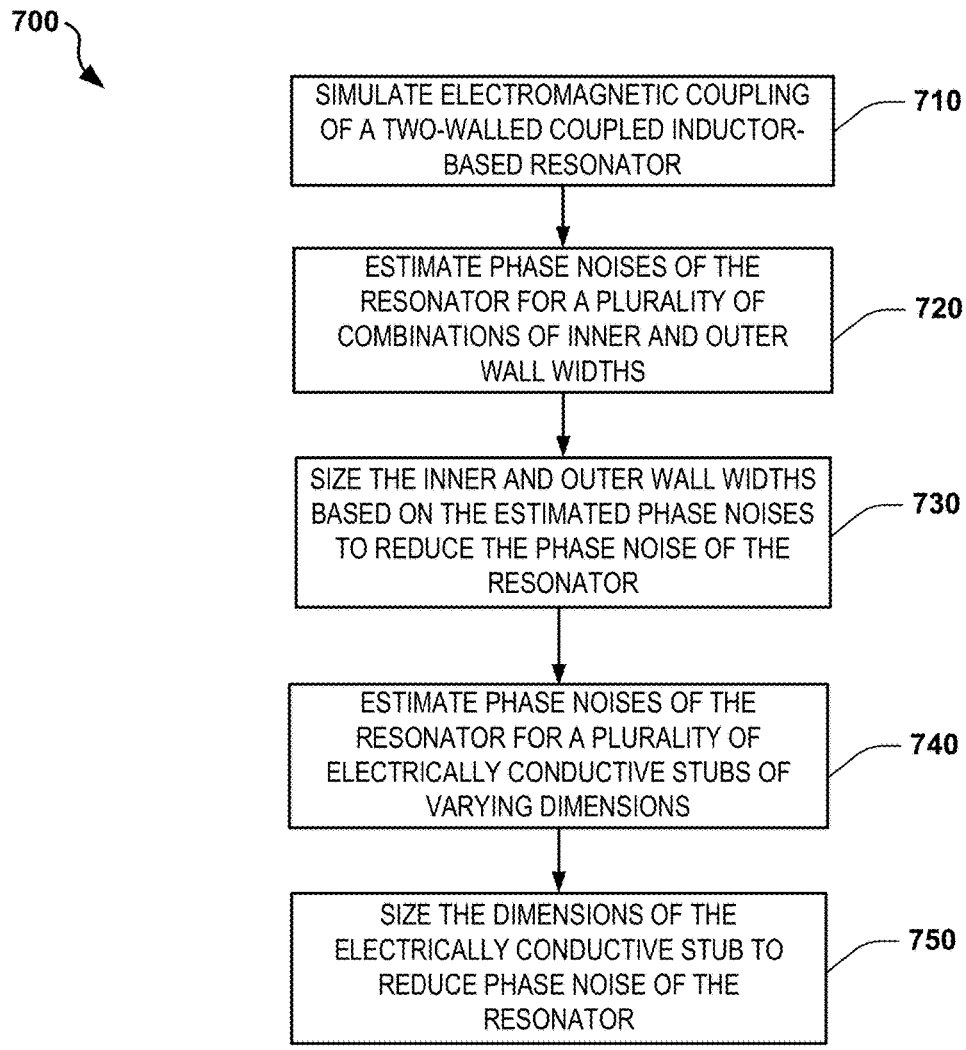
FIG. 7 is a flowchart block diagram of the process for designing the two-walled coupled inductor in the VCO of FIG. 1.

FIG. 7 is a flowchart block diagram of a process 700 for designing a two-walled coupled inductor. For example, the process 700 may be used to size portions of the two-walled coupled inductor 102 illustrated in FIGS. 1, 3 and 4. The process 700 of FIG. 3 may be performed with any suitable inductor-based resonator circuit; however, to provide a specific example, the process 700 will be described with reference to VCO 100 and the two-walled coupled inductor 102 illustrated in FIGS. 1, 3 and 4.

In block 710, the process 700 simulates electromagnetic coupling of at least a differential mode and a common mode in a two-walled coupled inductor 102, such as, for example the two-walled coupled inductor 102 of FIGS. 1, 3 and 4. The simulation of block 710 models current flow through the electrically conductive outer wall 104 having a first width $W_1$ and through the electrically conductive inner wall 106 separated from the outer wall by the slit 108 of width $W_{slit}$, the inner wall having a second width $W_2$. The simulation of block 710 also couples the inner wall 106 and the outer wall 104 at the first and second nodes 122 and 124. The simulation at block 710 models the common mode current flowing through the outer wall 104 and the differential mode current flowing through both the outer wall 104 and the inner wall 106.

The simulation of block 710 can change the various dimensions of the outer wall 104, the inner wall 106 and the slit 108. At block 720, the process estimates, based on the simulated electromagnetic coupling of block 710, phase noises of the two-walled coupled inductor 102 for a plurality of combinations of the outer wall width $W_1$, the inner wall width $W_2$ by varying the location of the slit 108 by varying, for example, the a ratio of equation (2). The combined widths of the outer wall 104 and the inner wall 106 may be held constant by varying the a ratio in order to vary the inductance of the common mode while keeping the differential mode inductance essentially constant.

At block 730, the process 700 sizes the width of the outer wall ($W_1$) and the width of the inner wall ($W_2$) based on the phase noises estimated at block 720 to reduce the phase noise of the two-walled coupled inductor 102. In various examples, the sizing at block 730 includes choosing the combination of outer wall width $W_1$ and inner wall width $W_2$ that resulted in a minimum phase noise estimate for the plurality of combinations of outer wall width $W_1$ and inner wall width $W_2$ analyzed at block 720.

In various examples, the simulation of block 710 models the electrically conductive stub 110 coupled to the outer wall 104. In these example simulations, the common mode current flows through the electrically conductive stub 110 and the outer wall 104 and the differential mode current does not flow through the electrically conductive stub 110. In these example simulations, the dimensions of the stub 110, stub length $\ell_{stub}$ and stub width $W_{stub}$, may also be varied. At block 740, the process 700 estimates phase noises of the inductor-based resonator, based on the simulated electromagnetic coupling of block 710, for a plurality of electrically conductive stubs of varying dimensions.

At block 750, the process 700 sizes the dimensions of the electrically conductive stub 110, based on the estimated phase noises, to reduce phase noise of the two-walled inductor 102. The sizing at block 750 may include choosing the dimensions of one of the plurality of electrically conductive stubs that resulted in a minimum estimated phase noise at block 740.

Upon sizing the dimensions of the various components of the two-walled coupled inductor 102 at block 730 and/or block 750, the outer wall 104, the inner wall 106 and, in some examples, the stub 110 may be formed on a substrate using known techniques, based on the sizing performed at blocks 730 and/or 750. The outer wall 104, the inner wall 106 and the stub 110 may, for example, be formed on a substrate to be coupled to the power supply 120 and the VCO circuitry 115 to form the VCO 100 of FIGS. 1-3.

The process 700 of FIG. 7 may be modified, for example, by adding or altering blocks. Additionally, the blocks may be performed concurrently. For example, the simulation of the electromagnetic coupling of the two-walled coupled inductor 102 of block 710 may also simulate current flowing from the power supply 120 coupled to the electrically conductive stub 110. Further, the simulation of the electromagnetic coupling of the two-walled coupled inductor 102 of block 710 may also simulate current flowing from the first and second nodes 122 and 124 of the two-walled coupled inductor 102 through voltage controlled oscillator (VCO) circuitry 115 coupled to the first and second nodes 122 and 124. In another example, the electrically conductive stub 110 may be coupled to the inner wall 106 rather than the outer wall 104 such that the common mode current flows through the inner wall 106 and not the outer wall 104. In this example, the simulation of the electromagnetic coupling at block 710 would simulate this scenario.

Although particular embodiments are described above, many variations of the disclosure are possible, including, for example, those with different transistor types, with different biasing arrangements, or with additional amplification stages. Additionally embodiments have been described for CMOS technology but similar circuits may be used with other technologies. Additionally, features of the various embodiments may be combined in combinations that differ from those described above.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. A two-walled coupled inductor comprising:
a first electrically conductive wall having a first end, a second end and a first width;
a second electrically conductive wall separated from the first wall by a slit, the second wall having a first end, a second end and a second width;
a first node where the first ends of the first and second electrically conductive walls are coupled;
a second node where the second ends of the first and second electrically conductive walls are coupled; and
an electrically conductive stub coupled to one of the first electrically conductive wall and the second electrically conductive wall and configured to be coupled to a power supply;
wherein an inductance of a common mode is based at least in part on a length of the electrically conductive stub; and
wherein an inductance of a differential mode is based at least in part on a width of the first wall and a width of the second wall.

2. The two-walled coupled inductor of claim 1, wherein the first and second nodes are configured to be coupled to voltage controlled oscillator (VCO) circuitry such that a current of the common mode flows through the electrically conductive stub and the one of the first electrically conductive wall and the second electrically conductive wall coupled to the electrically conductive stub and the differential mode current flows through both the first electrically conductive wall and the second electrically conductive wall and does not flow through the electrically conductive stub.

3. The two-walled coupled inductor of claim 1, wherein the electrically conductive stub provides an inductance to suppress one or more frequency harmonics of the common mode current to reduce phase noise in the two-walled coupled inductor.

4. The two-walled coupled inductor of claim 1, further comprising the power supply coupled to the electrically conductive stub to supply power to the two-walled coupled inductor.

5. The two-walled coupled inductor of claim 1, further comprising:
the VCO circuitry coupled to the first and second nodes; and
the power supply coupled to the electrically conductive stub to supply power to the two-walled coupled inductor and the VCO circuitry.

6. The two-walled coupled inductor of claim 1, wherein the first width of the first electrically conductive wall and the second width of the second electrically conductive wall are sized to provide the inductances of the common mode and the differential mode that reduce phase noise due to electromagnetic coupling of the common mode and the differential mode.

7. The two-walled coupled inductor of claim 1, wherein the first electrically conductive wall and the second electrically conductive wall form two concentric loops.

8. A method of reducing phase noise in a voltage controlled oscillator, the method comprising:
flowing common mode current through a first wall of a two-walled coupled inductor;
flowing differential mode current through the first wall and a second wall of the two-walled inductor, the first and second wall being separated at least partially by a slit; and
flowing the common mode current through an electrically conductive stub coupled to the first wall;
wherein a common mode inductance is based at least in part on a length of the electrically conductive stub; and
wherein a differential mode inductance is based at least in part on a width of the first wall and a width of the second wall.

9. The method of claim 8, wherein a ratio of common mode inductance to differential mode inductance of the two-walled coupled inductor is greater than ¼.

10. The method of claim 8, further comprising suppressing a second harmonic of the common mode current.

11. An apparatus comprising:
a first means for conducting electrical current comprising a first end, a second end and a first width;
a second means for conducting electrical current comprising a first end, a second end and a second width, the second means for conducting electrical current and first means for conducting electrical current separated by a slit;
first means for coupling the first ends of the first and second means for conducting electrical current;
second means for coupling the second ends of the first and second means for conducting electrical current;
a third means for conducting electrical current coupled to one of the first and second means for conducting electrical current; and
means for supplying electrical current coupled to the third means for conducting electrical current such that a common mode current flows through the third means for conducting electrical current and through the one of the first and second means for conducting electrical current coupled to the third means for conducting electrical current, and a differential mode current flows through both the first and second means for conducting electrical current and does not flow through the third means for conducting electrical current.

12. The apparatus of claim 11, wherein the first and second widths are different and are sized to increase an inductance of the common mode compared to an inductance of the differential mode.

13. The apparatus of claim 11, wherein the third means for conducting electrical current provides an increased inductance to the common mode to reduce phase noise in the apparatus due to electromagnetic coupling of the common mode and the differential mode.

14. The apparatus of claim 11, wherein the means for supplying electrical current is coupled to the third means for conducting electrical current to supply power to the apparatus.

15. The apparatus of claim 11, further comprising:
means for controlling an oscillating electrical waveform produced by the apparatus, the means for controlling coupled to the first and second means for coupling;
wherein the means for supplying electrical current supplies power to the means for controlling the oscillating electrical waveform.

16. The apparatus of claim 11, wherein the first width of the first means for conducting electrical current and the second width of the second means for conducting electrical current are sized to provide inductances of the common mode and the differential mode that reduce phase noise due to electromagnetic coupling of the common mode and the differential mode.

17. The apparatus of claim 11, wherein the first means for conducting electrical current and the second means for conducting electrical current form two concentric loops.

18. A voltage controlled oscillator (VCO) comprising:
a two-walled coupled inductor comprising:
a first electrically conductive wall having a first end, a second end and a first width,
a second electrically conductive wall separated from the first wall by a slit, the second wall having a first end, a second end and a second width,
a first node where the first ends of the first and second electrically conductive walls are coupled, and
a second node where the second ends of the first and second electrically conductive walls are coupled;
an electrically conductive stub coupled to the one of the first electrically conductive wall and the second electrically conductive wall and configured to be coupled to a power supply; and
VCO circuitry coupled to the first node and the second node,
wherein a common mode current flows through the one of the first electrically conductive wall and the second electrically conductive wall walls coupled to the power supply and a differential mode current flows through both the first electrically conductive wall and the second electrically conductive wall and does not flow through the electrically conductive stub.

19. The VCO of claim 18, wherein the first and second widths are sized to increase an inductance of the common mode compared to an inductance of the differential mode.

20. The VCO of claim 18, wherein the electrically conductive stub provides an increased inductance to the common mode to reduce phase noise in the two-walled coupled inductor due to electromagnetic coupling of the common mode and the differential mode.

21. The VCO of claim 18, further comprising the power supply coupled to the electrically conductive stub to supply power to the two-walled coupled inductor.

22. The VCO of claim 18, wherein the first width of the first electrically conductive wall and the second width of the second electrically conductive wall are sized to provide inductances of the common mode and the differential mode that reduce phase noise due to electromagnetic coupling of the common mode and the differential mode.

23. The VCO of claim 18, wherein the first electrically conductive wall and the second electrically conductive wall form two concentric loops.

24. The VCO of claim 18, wherein the VCO circuitry comprises at least one cross coupled transistor pair and at least one variable capacitance.

* * * * *